United States Patent
Tsai

(10) Patent No.: US 8,237,861 B2
(45) Date of Patent: Aug. 7, 2012

(54) VIDEO HORIZONTAL SYNCHRONIZER

(75) Inventor: Tien-Ju Tsai, Tainan County (TW)

(73) Assignee: Himax Media Solutions, Inc., Sinshih Township, Tainan County (TW)

( * ) Notice: Subject to any disclaimer, the term of this patent is extended or adjusted under 35 U.S.C. 154(b) by 403 days.

(21) Appl. No.: 12/577,838

(22) Filed: Oct. 13, 2009

(65) Prior Publication Data

US 2011/0085081 A1  Apr. 14, 2011

(51) Int. Cl.
*H03L 7/00* (2006.01)

(52) U.S. Cl. ........ 348/540; 348/543; 348/547; 348/545; 348/500; 348/530; 348/505; 348/512; 348/509; 348/521

(58) Field of Classification Search ............ 348/540, 348/543, 547, 545, 500, 505, 509, 512, 521, 348/530
See application file for complete search history.

(56) References Cited

U.S. PATENT DOCUMENTS

| | | | | |
|---|---|---|---|---|
| 4,317,133 A * | 2/1982 | Fernsler et al. | ............... | 348/541 |
| 6,400,409 B1 * | 6/2002 | Wilber | ............... | 348/543 |
| 7,369,578 B2 * | 5/2008 | Roberts et al. | ............... | 370/506 |
| 8,022,872 B2 * | 9/2011 | Katayama et al. | ............... | 342/357.77 |
| 2002/0077768 A1 * | 6/2002 | McCall et al. | ............... | 702/141 |
| 2005/0212932 A1 * | 9/2005 | Steimle et al. | ............... | 348/246 |

* cited by examiner

*Primary Examiner* — Jefferey Harold
*Assistant Examiner* — Mustafizur Rahman
(74) *Attorney, Agent, or Firm* — Thomas|Kayden

(57) ABSTRACT

A video horizontal synchronizer outputting a line timing signal and an indicating flag of a received video signal for use in a video signal post-processing unit, including a filter outputting a wide bandwidth filtered and a narrow bandwidth filtered signals of the received video signal, a dynamic slicer threshold generator generating a slicer threshold, a timing recovery circuit generating a phase error and the line timing signal, a phase error statistics circuit averaging the phase error to generate a average phase error, a HSYNC checker generating a matching flag indicating whether a periodic pattern appears in the narrow bandwidth filtered signal according to the line timing signal, and a finite state machine controlling the dynamic slicer threshold generator, the timing recovery circuit, the phase error statistics circuit and the HSYNC checker and generating an indicating flag when the average phase error is small enough and the matching flag is confirmed.

10 Claims, 17 Drawing Sheets

VIDEO HORIZONTAL SYNCHRONIZER

FIELD OF THE INVENTION

The invention relates generally to a video horizontal synchronizer, and more particularly, to a video horizontal synchronizer with enhanced capability of horizontal synchronization.

DESCRIPTION OF THE RELATED ART

In TV systems, a complete frame is composed of a plurality of scanning lines which make up the frame in an interlaced manner. Referring to FIG. 1 which shows a waveform of a Composite Baseband Video Signal (CVBS) of a TV system such as the National Television System Committee (NTSC) TV system or the Phase Alternating Line (PAL)/Séquential Couleur Avec Mémoire (SECAM) TV system. Take the NTSC system as an example, a frame is composed of 525 scanning lines. The 525 scanning lines are grouped as an even field and an odd field. For the even fields, the first 20 scanning lines provide related timing control information, whereas the remaining scanning lines provide the required luminance and color information of a frame.

To accurately render a dynamic video frame on a display device, apart from the essential luminance and color information, video signals must include certain synchronization signals, such as horizontal, vertical or color carrier synchronization signals. In traditional TV systems, due to considerations such as the limited availability of channels or costs, the luminance and color information, as well as the synchronization signals, are merged together into a specific channel as a "composite video signal" for transmission. Following, the composite video signal is received by a receiving end, and the synchronization signals within the composite video signal is detected so that scanning lines and frame signals can be distinguished. FIG. 2 shows a waveform of a scanning line of the NTSC or PAL/SECAM TV system. For horizontal synchronization, as shown in FIG. 2, a pulse with a level dropping D1 with respect to the blanking level (0 IRE) and a fixed time period T2 is used to signal the beginning of the scanning line. This level dropping pulse is also called a HSYNC pulse. With the HSYNC pulse, boundaries of the scanning lines may be distinguished or detected by identifying the HSYNC pulse, thus achieving horizontal synchronization.

Traditionally, the level transition point of the HSYNC pulse is utilized as a reference point for horizontal synchronization. The transition point of the HSYNC pulse includes a falling point and a rising point, and a reference point can either be the falling or rising point, or both two points. During the horizontal synchronization, a phase error is calculated based on the reference point, and the calculated phase error is sent to an analog Phase Locked Loop (PLL) circuit to timely adjust the frequency and phase offsets of the scanning lines. However, the analog PLL circuit is often affected by humidity and component aging which deteriorate circuit performance. In addition, the analog PLL circuit is sensitive to noises during the transmission, especially in a wireless environment. Thus, reconstructed frames are negatively interfered with by noises and the synchronization mechanism on the receiving end is also negatively affected. In addition, some low-cost TV systems may generate defective video signals, such as the video signals that contain severe jitter or have higher frequency offset, or have a HSYNC pulse with an out of tolerance width (25% in maximum) or insufficient depth. The defective video signals make it difficult for the video horizontal synchronizer to recognize or detect the HSYNC pulse, which either causes a reconstructed frame to be distorted or shaken, or unable to be reconstructed.

BRIEF SUMMARY OF THE INVENTION

In light of the previously described problems, a video horizontal synchronizer capable of detecting/identifying defective video signals having a nonstandard HSYNC pulse is required.

The invention discloses a video horizontal synchronizer outputting a line timing signal and an indicating flag of a received video signal for use in a video signal post-processing unit, comprising a filter outputting a wide bandwidth filtered signal and a narrow bandwidth filtered signal of the received video signal, a dynamic slicer threshold generator generating a slicer threshold according to the wide bandwidth filtered signal within a time window, a timing recovery circuit generating a phase error and the line timing signal according to the wide bandwidth filtered signal and the slicer threshold, a phase error statistics circuit averaging the phase error to generate a average phase error, a HSYNC checker generating a matching flag indicating whether a periodic pattern appears in the narrow bandwidth filtered signal according to the line timing signal, and a finite state machine (FSM) controlling the dynamic slicer threshold generator, the timing recovery circuit, the phase error statistics circuit and the HSYNC checker according the status of the video horizontal synchronizer and generating an indicating flag when the average phase error is small enough and the matching flag is confirmed.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
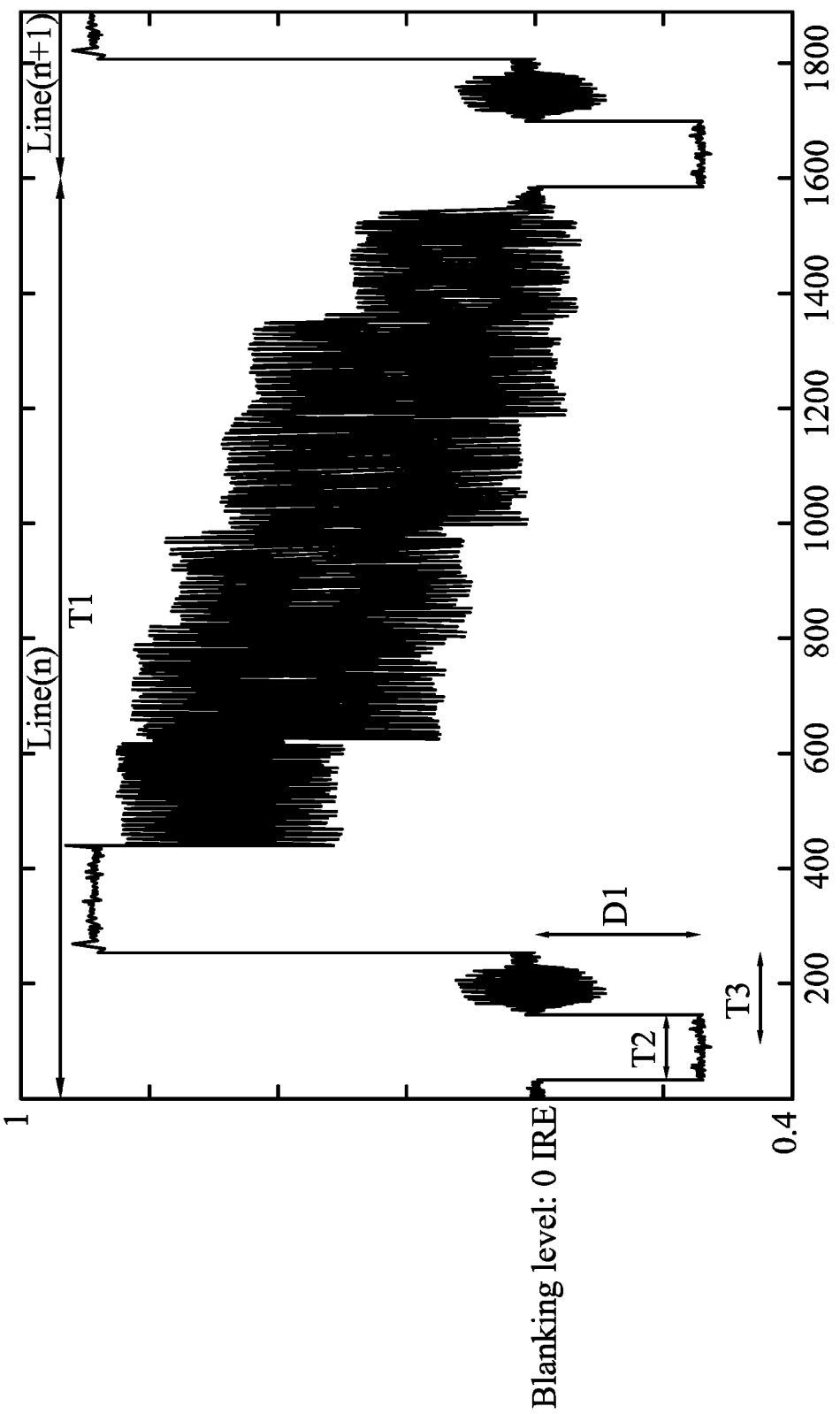
FIG. 2 shows a detailed waveform of a scanning line for the NTSC or PAL/SECAM TV system.

Referring to FIG. 2, the symbol T1 represents the time period of a complete scanning line (n). The value of the time period T1 is typically 63.556 µs for the NTSC system, and 64.000 µs for the PAL/SECAM system. The symbol T2 represents the time period of the HSYNC pulse, which is 4.7 µs for both TV systems. The symbol T3 represents the time period from the midpoint of the HSYNC pulse to the endpoint of the back-porch, which is typically 6.85 µs for the NTSC system and 7.95 µs for the PAL/SECAM system. The symbol D1 represents the level dropping of the HSYNC pulse with respect to the blanking level, which is typically −40IRE for the NTSC system and −43IRE for the PAL/SECAM system. The invention is capable of recognizing/detecting the scanning lines with a maximum tolerance of T1 by +/−5% (+/−3 µs), and a maximum tolerance of T2 by +/−25% (+/−1.18 µs). Also, the invention is able to recognize/detect the scanning lines as long as the period of T3 is greater than 4.73 µs (even if the period of T3 is merely slightly greater than 4.73) and the magnitude of the level dropping D1 is merely slightly greater than 0 IRE, which is really not a restrict condition required for recognizing/detecting scanning lines at all.

Figure 3:
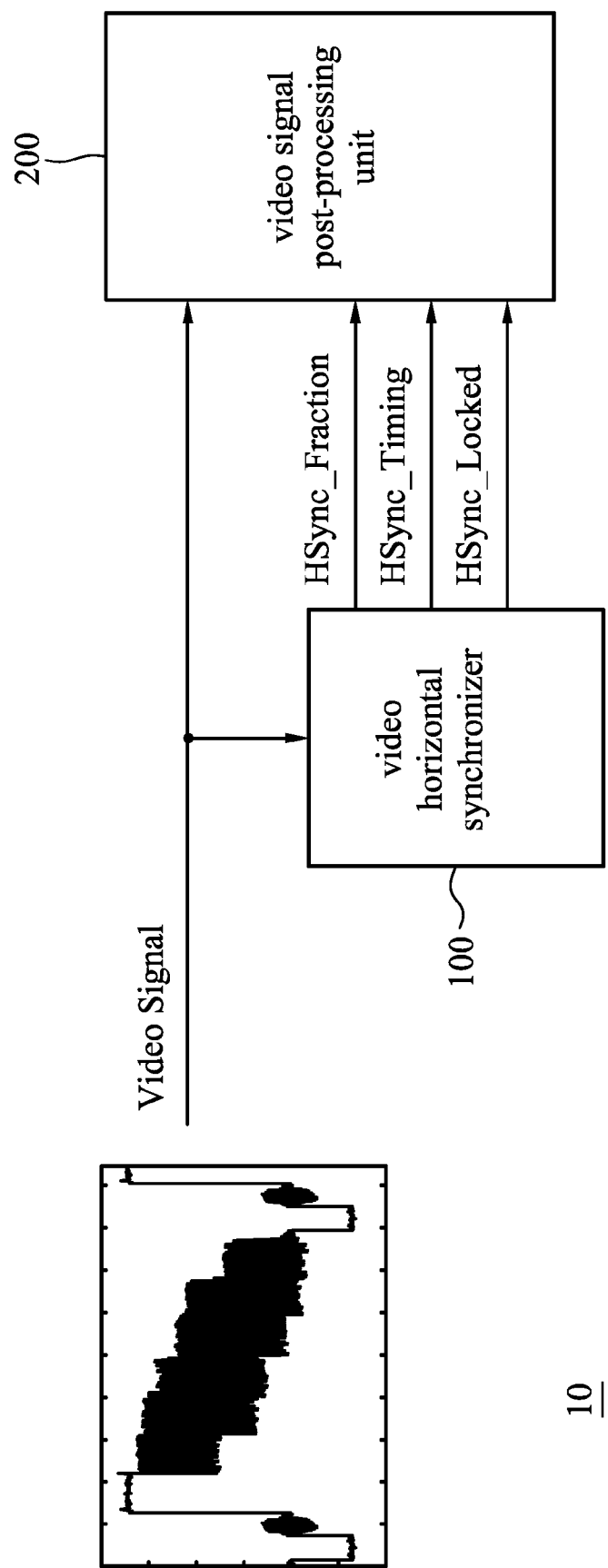
FIG. 3 shows a brief diagram of a video horizontal synchronization apparatus according to an embodiment of the invention.

FIG. 3 shows a brief diagram of a video horizontal synchronization apparatus according to an embodiment of the invention. The video horizontal synchronization apparatus 10 comprises a video horizontal synchronizer 100 and a video signal post-processing unit 200 that receives and processes the video signal along with the related line timing reference signals HSync_Timing and HSync_Fraction provided by the video horizontal synchronizer 100. In FIG. 3, a video signal is received by both the video horizontal synchronizer 100 and the video signal post-processing unit 200. The video signal is shown in FIG. 2. The video horizontal synchronizer 100 is in charge of synchronizing the scanning lines by detecting/identifying the HSYNC pulse, and providing information regarding the convergence condition of horizontal synchronization with a indicating flag HSync_Locked and two line timing reference signals HSync_Timing and HSync_Fraction. The indicating flag HSync_Locked serves to indicate whether horizontal synchronization has been achieved or not. When horizontal synchronization is achieved, the line timing reference signals HSync_Timing and HSync_Fraction provide the timing references accurately indicating the ongoing progress of the scanning line being currently processed. The detailed operation of the two indicators is described later.

Figure 4:
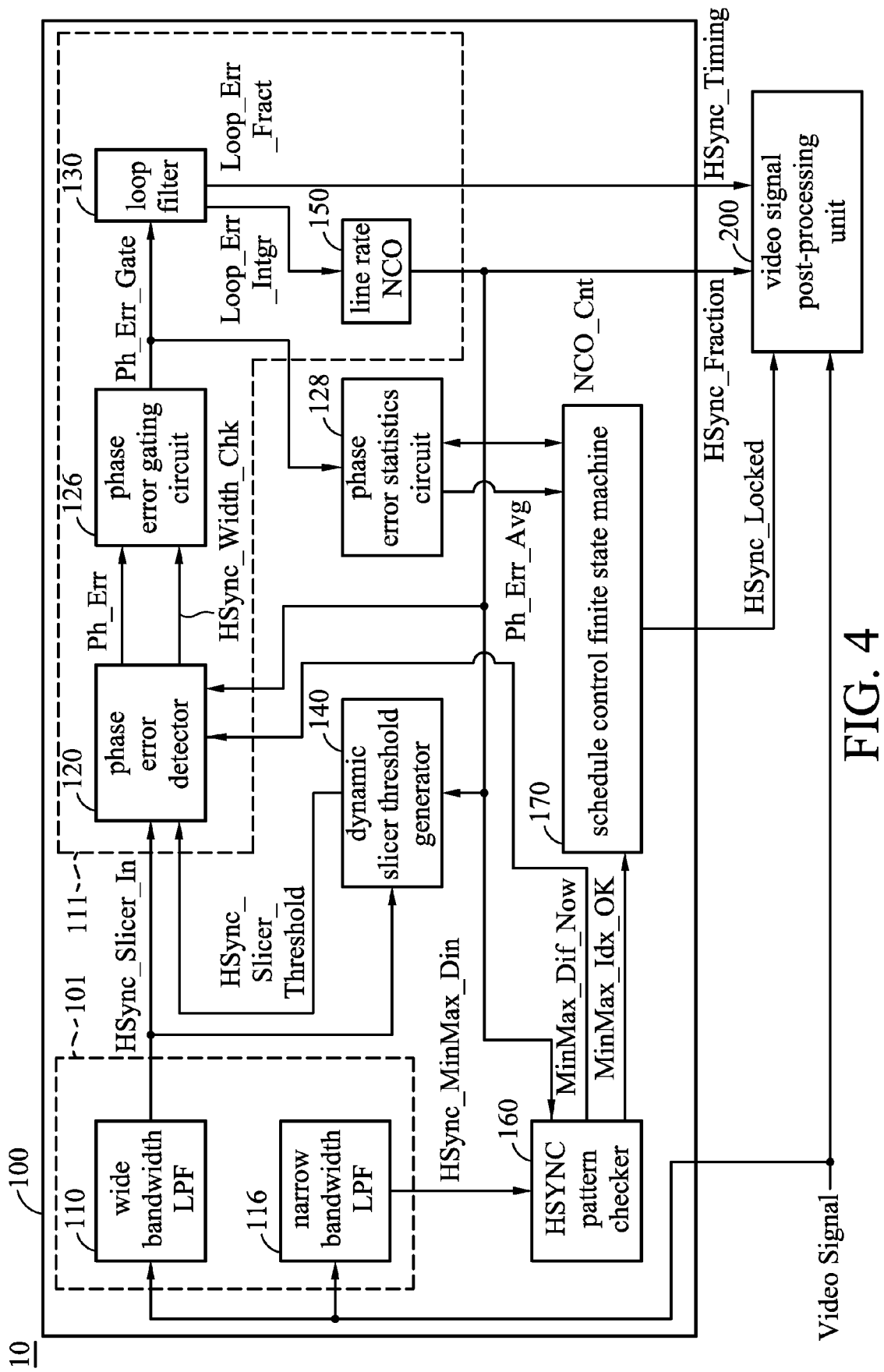
FIG. 4 shows a block diagram of a video horizontal synchronizer according to an embodiment of the invention.

FIG. 4 shows a block diagram of a video horizontal synchronizer according to an embodiment of the invention. The video horizontal synchronizer 100 comprises a wide bandwidth low pass filter (LPF) 110, a narrow bandwidth LPF 116, a phase error detector 120, a phase error gating circuit 126, a phase error statistics circuit 128, a loop filter 130, a dynamic slicer threshold generator 140, a line rate numerically controlled oscillator (NCO) 150, a HSYNC pattern checker 160 and a schedule control finite state machine (FSM) 170. The wide bandwidth LPF 110 and the narrow bandwidth LPF 116 may generally be considered as a filter circuit 101. In addition, the phase error detector 120, the phase error gating circuit 126, the loop filter 130 and the line rate NCO 150 may generally be considered as a timing recovery circuit 111. The detailed functioning of the components is illustrated below.

Figure 5A:
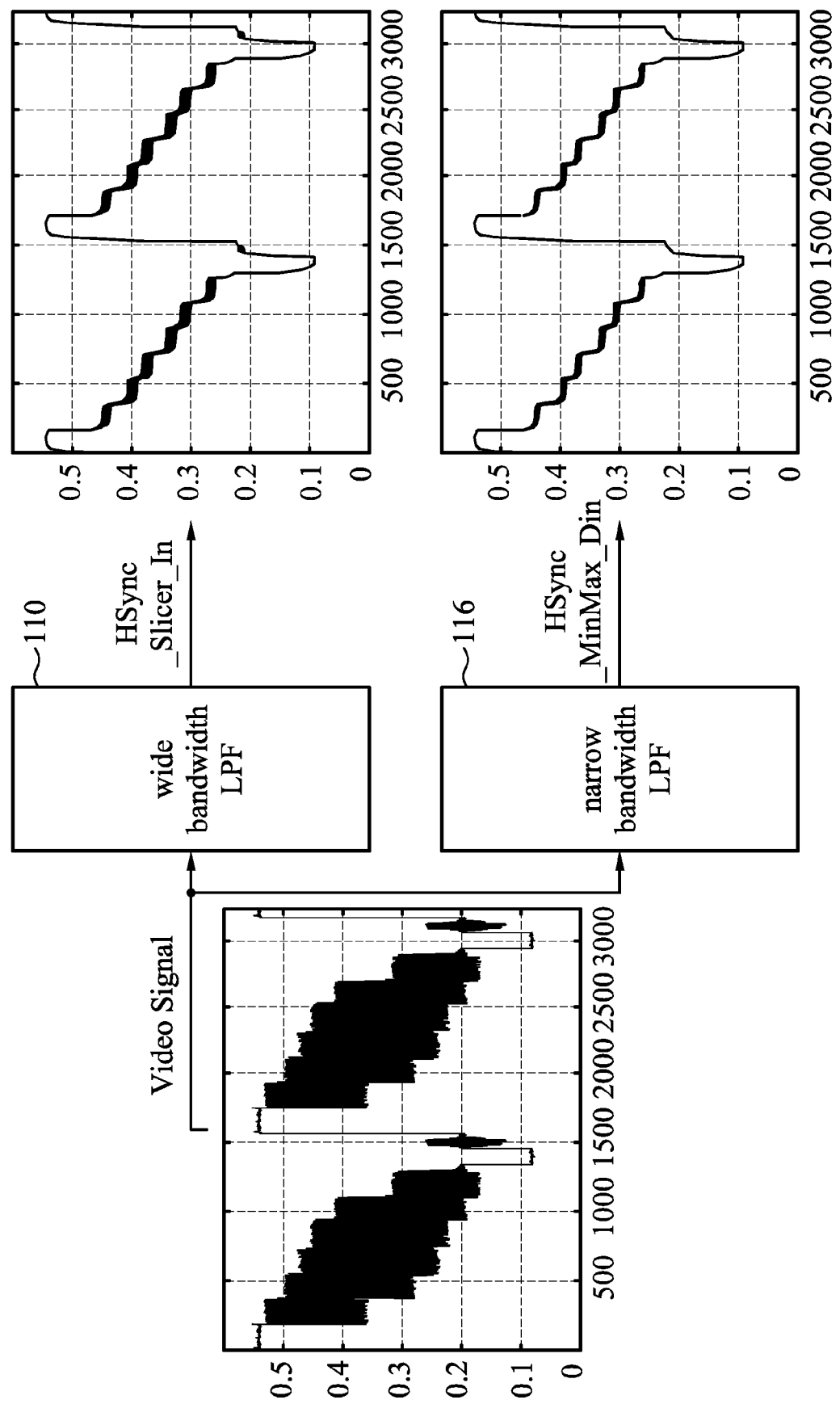
FIG. 5A shows the output signals from a wide bandwidth LPF and a narrow bandwidth LPF according to an embodiment of the invention.
Figure 5B:
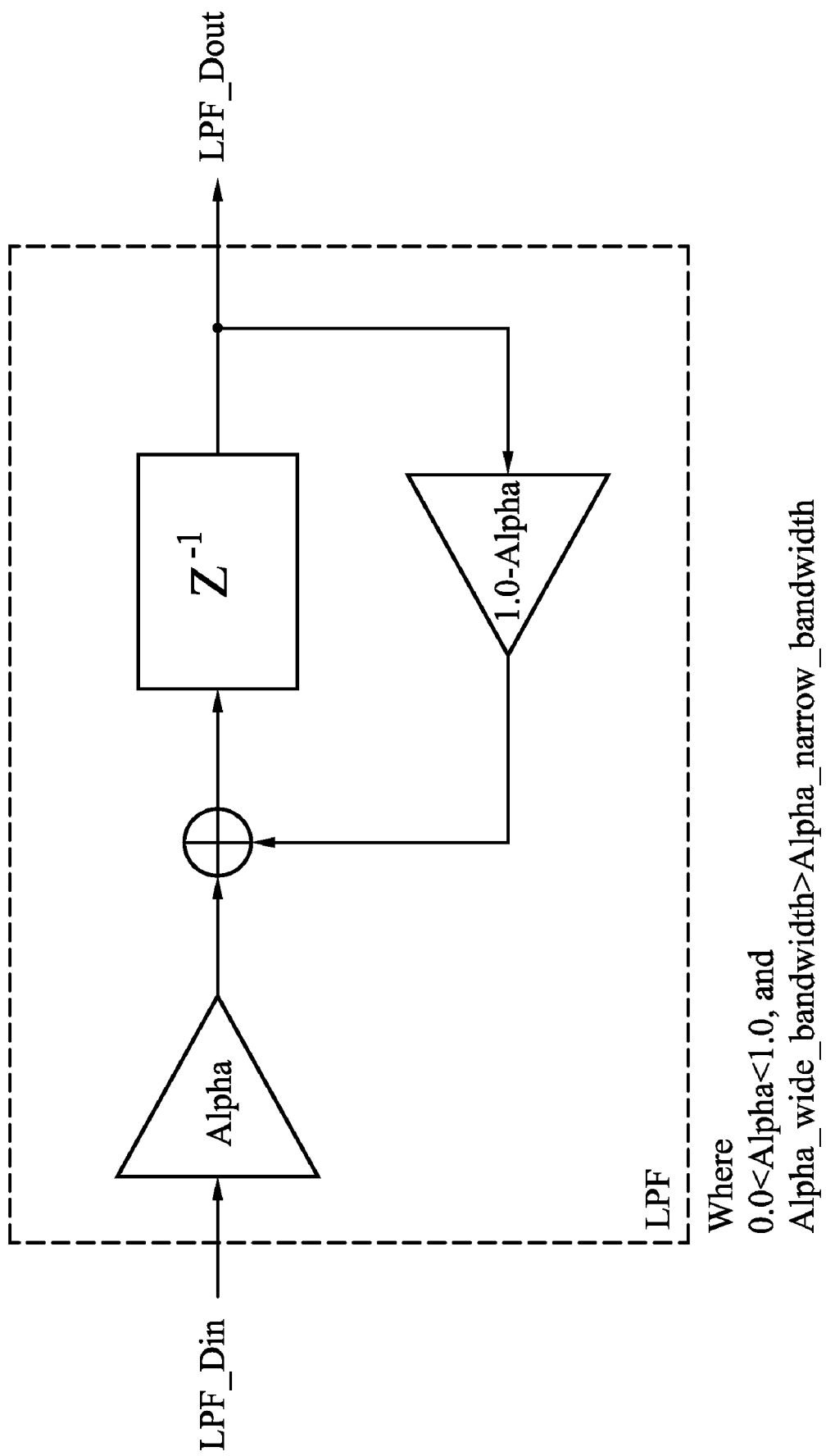
FIG. 5B shows a circuit diagram of a wide/narrow bandwidth LPF according to an embodiment of the invention.

FIG. 5A shows the output signals from a wide bandwidth LPF 110 and a narrow bandwidth LPF 116 according to an embodiment of the invention. For horizontal synchronization, the high frequency portion of the video signal is unwanted (only the HSYNC pulse is needed). Therefore, the wide bandwidth LPF 110 and the narrow bandwidth LPF 116 are used to filter the high frequency portion of the video signal, as shown in FIG. 5A. Referring to the narrow bandwidth filtered signal HSync_MinMax_Din outputted by the narrow bandwidth LPF 116, only a minimal high frequency portion of the output signal is shown. Referring to the wide bandwidth filtered signal HSync_Slicer_In outputted by the wide bandwidth LPF 110, some high frequency portion is still remaining therein, as the fluffy portion of the waveform shows in FIG. 5A, despite the high frequency signal being almost completely filtered. FIG. 5B shows a circuit diagram of the LPFs 110 and 116 according to an embodiment of the invention. In FIG. 5B, the alpha is a constant between 0 and 1, and the alpha of the wide bandwidth LPF 110 is greater than the alpha of the narrow bandwidth LPF 116.

In FIG. 4, at the beginning, the timing recovery circuit 111 is open-looped. In the phase, the timing recovery circuit 111 receives the wide bandwidth filtered signal HSync_Slicer_In and a slicer threshold HSync_Slicer_Threshold generated by the dynamic slicer threshold generator 140. Based on this, the timing recovery circuit 111 outputs a signal Ph_Err_Gate and a line timing signal NCO_Cnt. The signal Ph_Err_Gate is sent to the phase error statistics circuit 128, and the line timing signal NCO_Cnt is sent to the phase error detector 120, phase error statistics circuit 128, dynamic slicer threshold generator 140, HSYNC pattern checker 160 and schedule control FSM 170. Note that at the beginning, because the timing recovery circuit 111 is not yet activated (open-looped), an initial value is provided as the line timing signal NCO_Cnt to related circuit blocks. During the phase, the phase error of the received video signal is determined by a variable Min-Max_Idx_Now which is obtained from the HSYNC pattern checker 160. The detail will be illustrated later in the specification.

Figure 6:
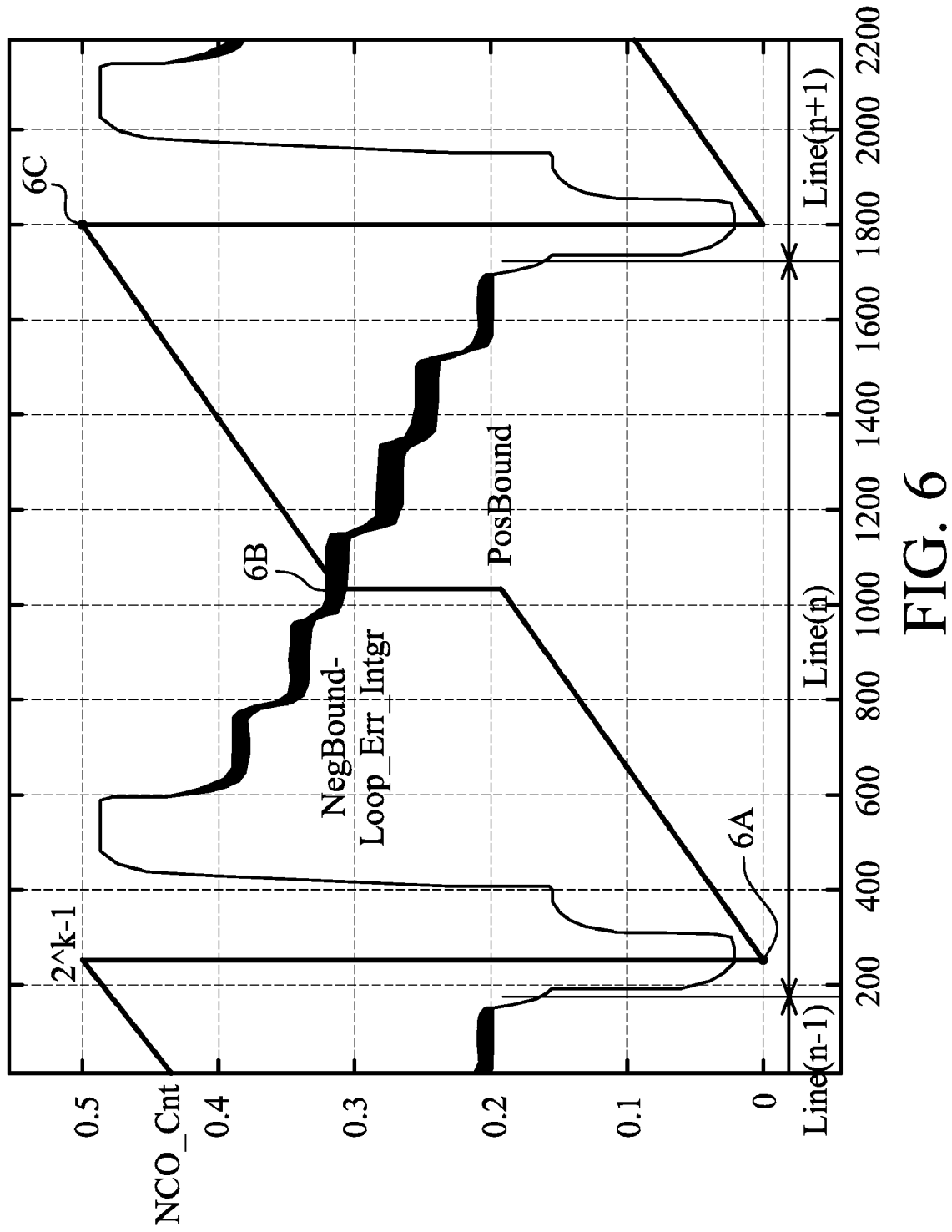
FIG. 6 shows a waveform of a line timing signal and scanning lines according to an embodiment of the invention.
Figure 7:
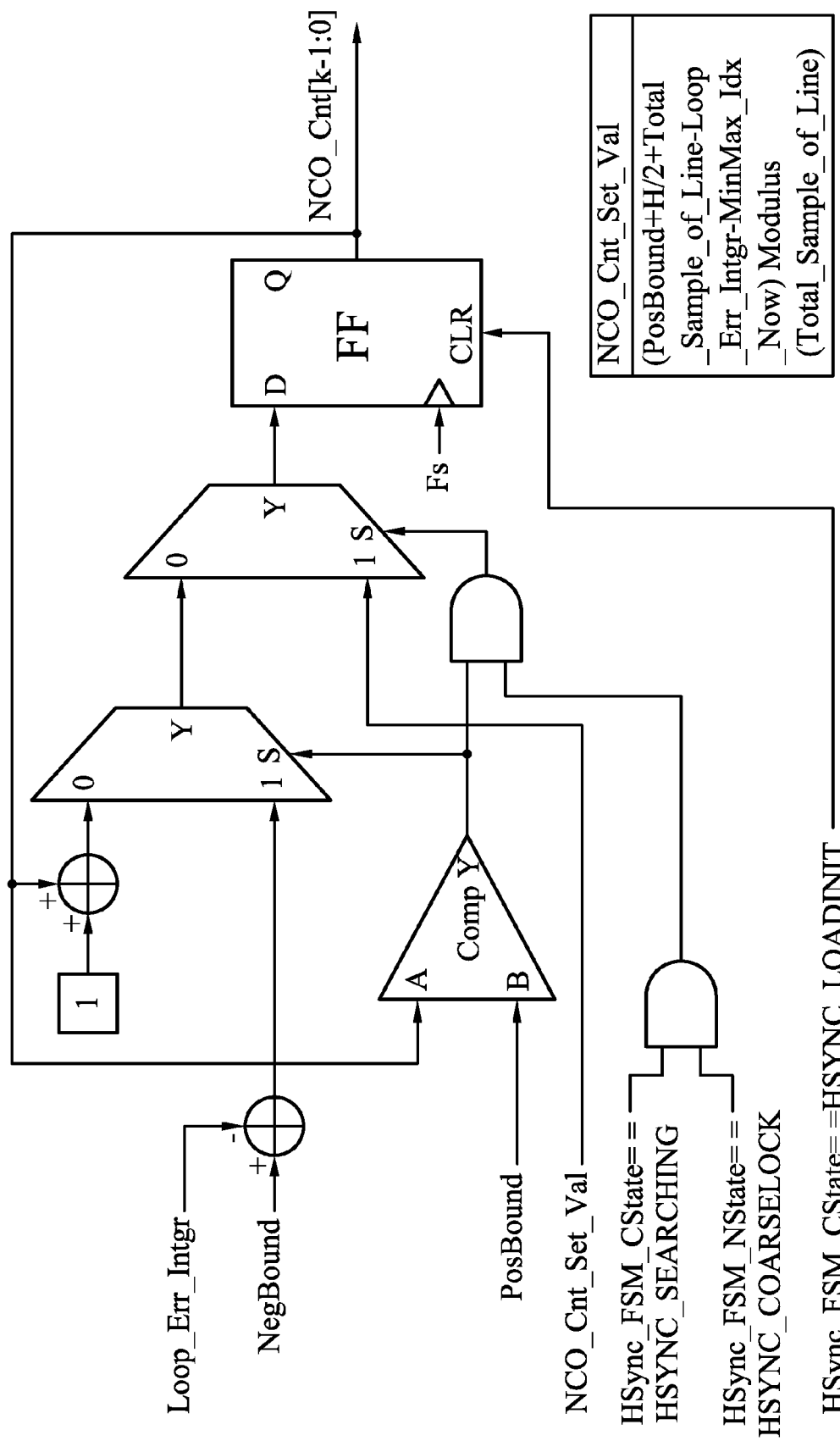
FIG. 7 shows a circuit diagram of a line rate NCO according to an embodiment of the invention.

In FIG. 4, the line rate NCO 150 may be realized with a k-bit counter (not shown) which generates a line timing signal NCO_Cnt as shown in FIG. 6. FIG. 6 also shows a waveform of scanning lines (n−1), (n) and (n+1). The cycle period of the line timing signal NCO_Cnt is expected to be the same as the time period of the scanning lines once horizontal synchronization has been achieved, which is 63.556 µs for the NTSC system and 64.000 µs for the PAL/SECAM systems typically. FIG. 7 shows a circuit diagram of the line rate NCO 150 according to an embodiment of the invention. In FIG. 7, the NegBound and PosBound represent two constant values in the format of k-bit unsigned binary expression, which are determined based on the sampling rate of the TV system. Take the NTSC system with the sampling rate of 24.576 MHz as an example (note the sampling rate of NTSC system may not necessarily be 24.576 MHz), the time period T1 of the scanning line is determined to be 63.556 us. Thus, a scanning line is made up of around 1562 samples. In addition, the time period of a scanning line may have a tolerance of up to +/−5%, which corresponds to another +/−74 samples required, approximately. In total, the maximum required count values for samples is 1562 plus 74, which requires a 11-bit counter for providing a maximum count value up to 2048 ($2^{11}$, through 0 to 2047). Based on this, two ranges of count values from 0 to 780 and 1267 to 2047 amounting to the required 1562 count values are chosen. Therefore, the maximum count value 780 for the first range is determined as the value of a PosBound. In addition, the minimum count value 1267 for the second range is determined as the value of a NegBound. Referring back to the line timing signal NCO_Cnt shown in FIG. 6, point 6A is where counting of the line rate NCO 150 begins (value 0). The count jumps to the NegBound value minus a loop error Loop_Err_Intgr (point 6B), while counting to the PosBound (value 780). The loop error Loop_Err_Intgr is dynamically generated by the loop filter 130 shown in FIG. 4. Starting from point 6B, the counting continues until the maximum value 2047 (point 6C) where the counting will be automatically wrapped around to 0 for a next counting period, called a wraparound point (initial index), is reached. Ideally, the wraparound point is expected to be located in the middle of the HSYNC pulse if the horizontal synchronization is precisely achieved, as is shown in FIG. 6. In such a case, the phase error Ph_Err would be very small. However, a larger phase error Ph_Err occurs if the horizontal synchronization is not precisely achieved, as will be described later in reference to a state HSYNC_COARSELOCK. On the other hand, the loop error Loop_Err_Intgr is used to reflect the line rate offset between a standard/default scanning line (whose frequency is 15734 Hz as an example of NTSC system, determined from 1/63.556 μs) and an actually-received scanning line (i.e. the actually-received video signal in FIG. 4 whose frequency is 15625 Hz). As a result, the loop error Loop_Err_Intgr dynamically contributes to the adjustment of the count value of the counter. It is noted that the circuit diagram shown in FIG. 7 is merely an embodiment for the line rate NCO 150 and is not limited thereto.

Figure 8A:
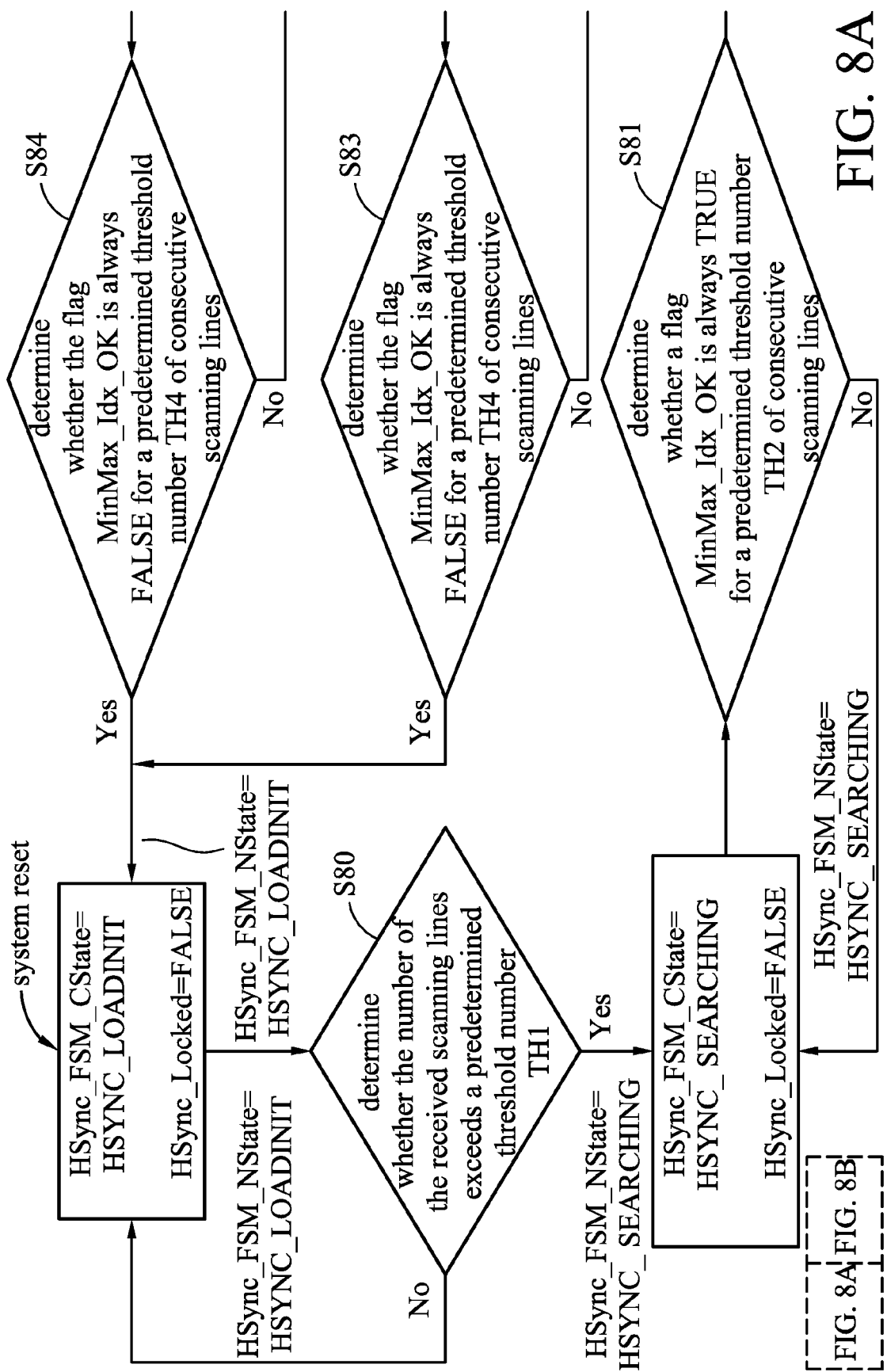
FIGS. 8A and 8B show a flowchart of a schedule control FSM according to an embodiment of the invention.
Figure 8B:
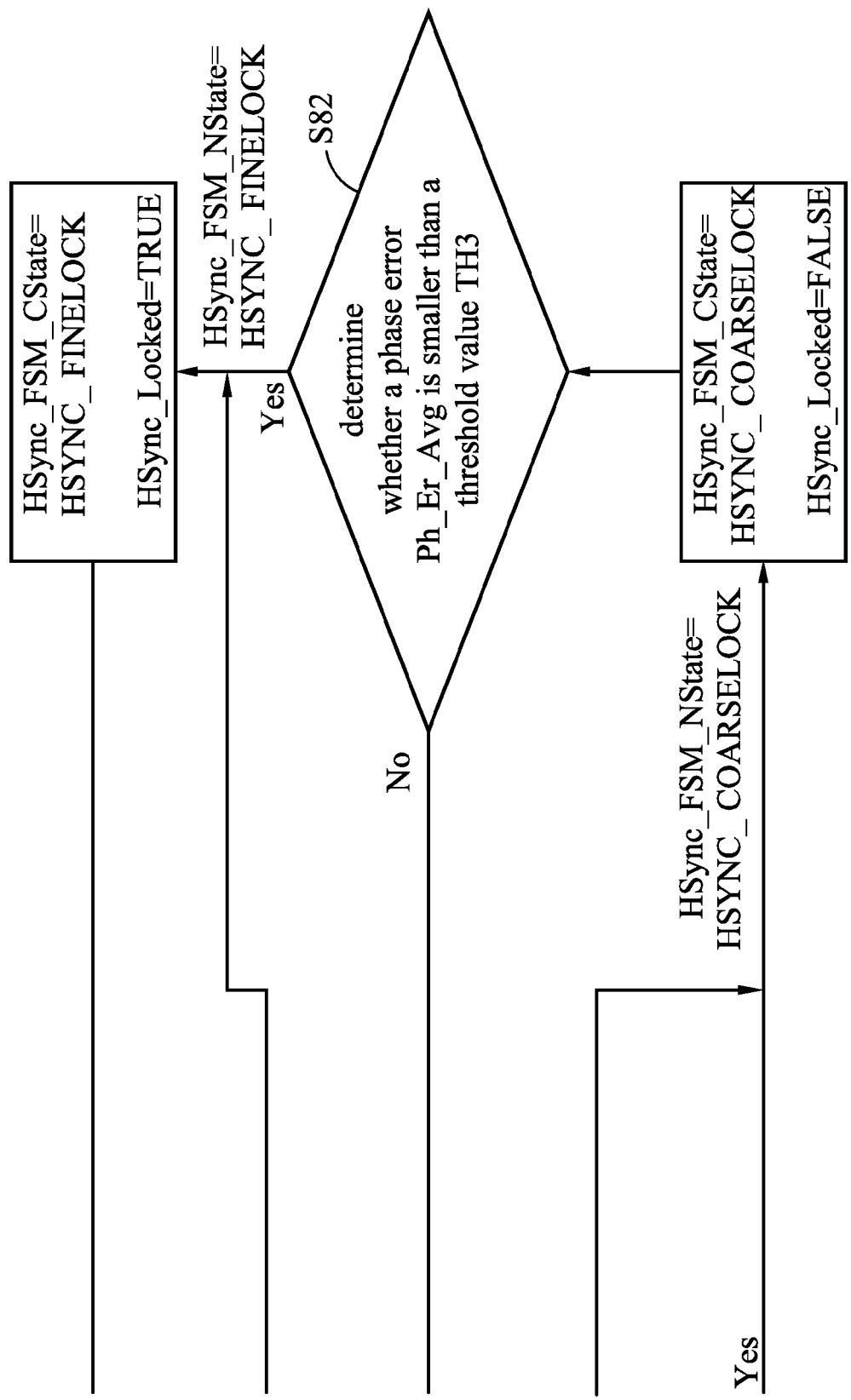
Figure 9:
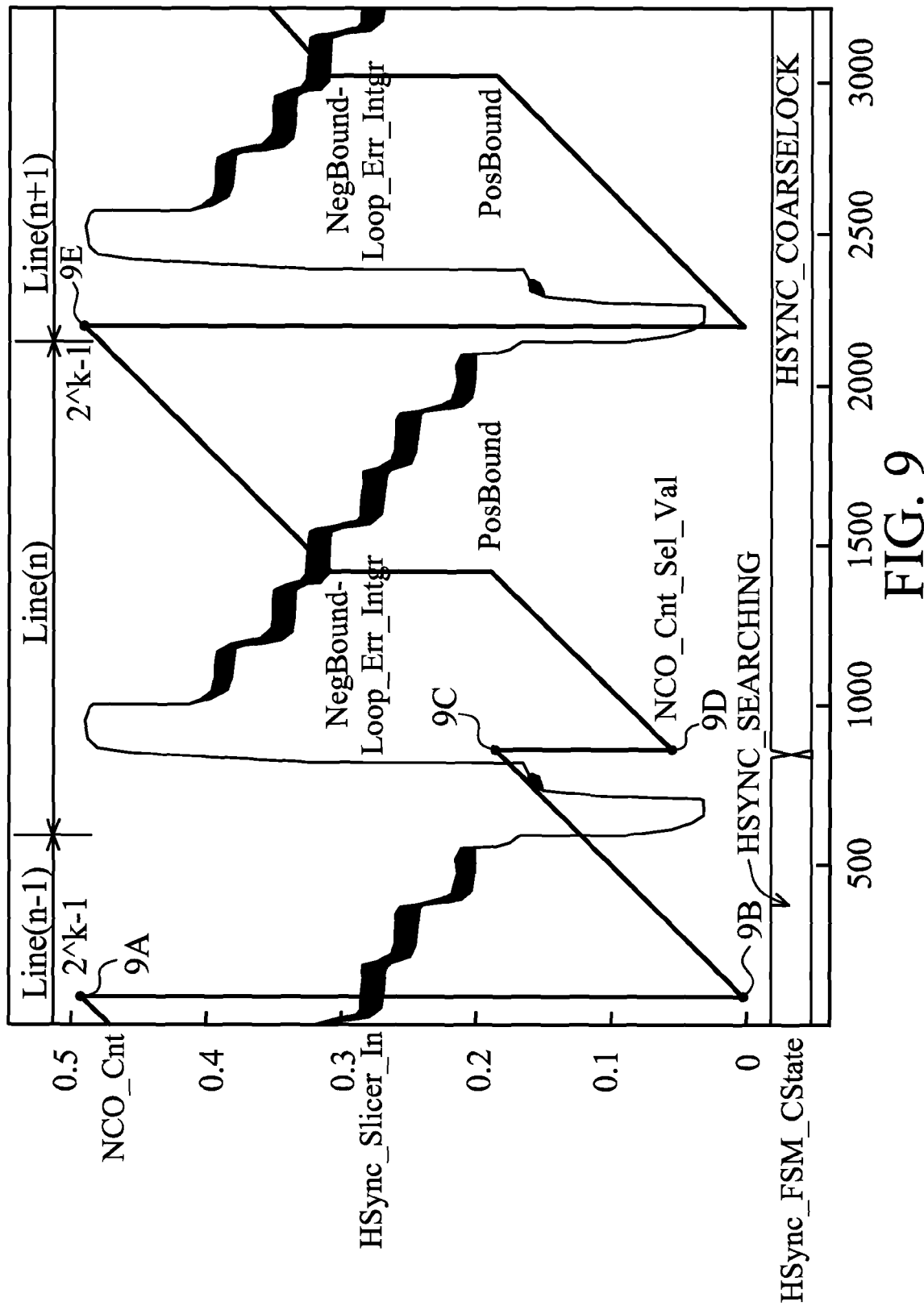
FIG. 9 shows an example of a state HSYNC_SEARCHING according to an embodiment of the invention.

FIGS. 8A and 8B show a flowchart of a schedule control FSM according to an embodiment of the invention. 4 states of the schedule control FSM 170 are presented: HSYNC_LOADINIT, HSYNC_SEARCHING, HSYNC_COARSELOCK and HSYNC_FINELOCK. The system starts with the initial state HSYNC_LOADINIT, i.e. a system reset case. In the state, the indicating flag HSync Locked indicating whether the phase is locked is set as FALSE, informing the video signal post-processing unit 200 that horizontal synchronization has not yet been achieved. Next, it is determined whether the number of the scanning lines received by the video horizontal synchronizer 100 exceeds a predetermined threshold number TH1 (step S80). This step allows enough time for the residual values/content left by a previous action to be cleared. If the number of the received scanning lines exceeds the predetermined threshold number TH1, the procedure proceeds to the second state HSYNC_SEARCHING and a flag HSync_FSM_NState output by the schedule control FSM 170 is set as HSYNC_SEARCHING. In step S80, if the number of the scanning lines received by the video horizontal synchronizer 100 does not exceed the predetermined threshold number TH1, the procedure goes back to the initial state HSYNC_LOADINIT until the condition of the step S80 is met. In the second state HSYNC_SEARCHING, the indicating flag HSync_Locked is still set as FALSE. The scenario of the state is illustrated in FIG. 9. In FIG. 9, for the second state HSYNC_SEARCHING, the wraparound point 9A may be away from the middle of the HSYNC pulse where a location is desired (if phase locked), wherein related procedures would be performed to achieve the horizontal synchronization. In a next step, it is determined whether a matching flag MinMax_Idx_OK is always TRUE for a predetermined threshold number TH2 of consecutive scanning lines (step S81). The matching flag MinMax_Idx_OK is output by the HSYNC pattern checker 160 which determines whether the narrow bandwidth filtered signal HSync_MinMax_Din output by the LPF 116 is truly a desired scanning line that can be used for horizontal synchronization, because an undesired signal may be received by the LPF 116 (including some scanning lines with special HSYNC pattern used for vertical synchronization). If a desired scanning line is received, the matching flag MinMax_Idx_OK is set as TRUE. The matching flag MinMax_Idx_OK has to be TRUE for the predetermined threshold number TH2 of consecutive scanning lines in order to make sure that the received signals are proper for synchronization, as well as to obtain the rough line rate offset between a standard/default scanning line and an actually-received scanning line. Here, the procedure loops around the step S81 and the second state until the condition of the step S81 is satisfied. Meanwhile, referring to FIG. 9, the counting starts from 0 (point 9B) to the PosBound (point 9C). During the looping, the predetermined threshold number TH2 of scanning lines is observed to determine a new count value NCO_Cnt_Sel_Val. This new value NCO_Cnt_Sel_Val is determined once the condition of the step S81 is satisfied. Once the new value NCO_Cnt_Sel_Val is determined, the counting in FIG. 9 restarts with the determined new value NCO_Cnt_Sel_Val (point 9D) when the first counting to PosBound is reached (point 9C). The value NCO_Cnt_Sel_Val is a special value that ensures that a subsequent wraparound point will be located within the HSYNC pulse of a next period of scanning line (point 9E), but not necessarily located right in the middle of the HSYNC pulse. At this moment a rough location of the HSYNC pulse has been obtained and then the system enters a state HSYNC_COARSELOCK. Following the third state HSYNC_COARSELOCK, it is determined whether an average phase error Ph_Er_Avg calculated by the phase error statistics circuit 128 is smaller than a threshold value TH3 (step S82). The average phase error Ph_Er_Avg indicates the degree that the wraparound point is off from the middle of the HSYNC pulse. The further the wraparound point is off from the middle of the HSYNC pulse, the larger the average phase error Ph_Er_Avg is. If the average phase error Ph_Er_Avg is smaller than the threshold value TH3 following the third state HSYNC_COARSELOCK, the procedure proceeds to the final state HSYNC_FINELOCK, achieving horizontal synchronization. If not, the procedure proceeds to the next step, and determines whether the matching flag MinMax_Idx_OK is always FALSE for a predetermined threshold number TH4 of consecutive scanning lines (step S83). If not, the procedure goes back to the third state HSYN_COARSELOCK. If so, the procedure goes back to the initial state HSYNC_LOADINIT, to restart the steps. If the procedure goes back to the initial state HSYNC_LOADINIT, it may either be a case where the user has switched TV channels so that horizontal synchronization must be re-performed, or that the received video signal is temporarily out-of-reach. Following the final state HSYNC_FINELOCK, it is also determined whether the matching flag MinMax_Idx_OK is always FALSE for the predetermined threshold number TH4 of consecutive scanning lines (step S84), as determined in step S83. If so, similar to the step S83, the procedure goes back to the initial state HSYNC_LOADINIT, to restart the flow. If not, the procedure goes back to the final state.

As stated above, the HSYNC pattern checker 160 determines whether the narrow bandwidth filtered signal HSync MinMax Din output by the LPF 116 is truly a desired scanning line. This may be achieved via a variable MinMax_Var calculated by the HSYNC pattern checker 160. The value of this variable MinMax_Var should appear to have been converged if the received signal HSync_MinMax_Din is a desired one. The Formula of the variable MinMax_Var is:

$$\text{Abs (MinMax\_Dif\_Now} - \text{MinMax\_Dif\_Pre)}. \quad (A)$$

wherein, Abs represents the absolute value.

In addition, two variables are presented in Formula (A): MinMax_Dif_Now and MinMax_Dif_Pre.

Figure 10:
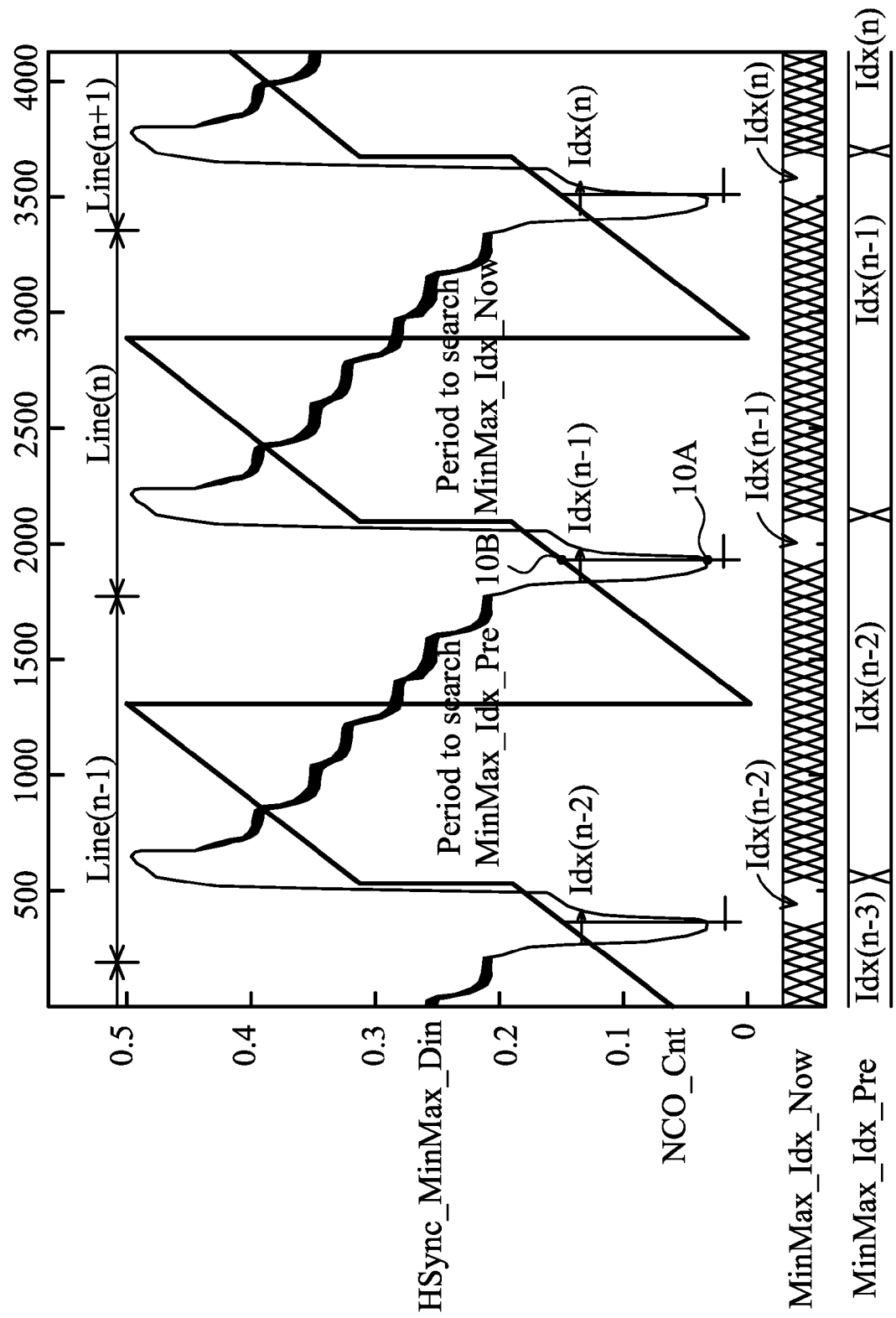
FIG. 10 shows a waveform of a HSYNC pattern checker according to an embodiment of the invention.

Take the variable MinMa_Dif_Now as an example, it is obtained by:

$$\text{(Total\_Sample\_of\_Line} + \text{MinMax\_Idx\_Now} - \text{Min-Max\_Idx\_Pre) Modulus (Total\_Sample\_of\_Line)} \quad (B),$$

wherein, the Total_Sample_of_Line is the complete counting cycle of the line rate NCO 150, which is 1562 for the NTSC system in this embodiment. In addition, the variable MinMax_Idx_Now represents the corresponding count value of the line rate NCO 150 when a current period of the narrow bandwidth filtered signal HSync_MinMax_Din is at a minimum value (it would be maximum value for a negative modulation system, such as NTSC). For example, referring to FIG. 10, a minimum value of a current period (line (n)) of the narrow bandwidth filtered signal HSync_MinMax_Din appears to be the negative peak value shown at point 10A. Therefore, the count value corresponding to the minimum value is defined as the variable MinMax Idx Now shown at point 10B. Similarly, another minimum value of a previous period (line (n-1)) of the narrow bandwidth filtered signal HSync_MinMax_Din may also be defined as MinMax_Idx_Pre (also, it would be maximum value for a negative modulation system). Based on the MinMax_Idx_Now and MinMax_Idx_Pre, a phase different MinMax_Dif_Now of the current period of the narrow bandwidth filtered signal HSync_MinMax_Din may be obtained using above Formula (B). Based on the principle above, another variable MinMax_Dif Pre of the previous period of the narrow bandwidth filtered signal HSync_MinMax_Din may also be determined. Thus, the value of the variable MinMax_Var is determined using the above Formula (A). If the variable MinMax_Var doesn't appear to have been converged as the horizontal synchronization took place, it suggests that the received signal HSync_MinMax_Din is not a desired one. Note for the MinMax_Idx_Pre, when in the states of HSYNC_COARSELOCK and HSYNC_FINELOCK, it is set as H/2 (half width of HSYNC pulse).

Note that in the states HSYNC_LOADINIT and HSYNC_SEARCHING, the variable MinMax_Dif_Now is used by the phase error detector 120 to reflect the line rate offset. When in the states HSYNC_COARSELOCK and HSYNC_FINELOCK, the phase error is calculated by the phase error detector. In addition, the matching flag MinMax_Idx_OK may be determined according to the following:

TABLE 1

| Condition of MinMax_Idx_OK | |
|---|---|
| HSync_FSM_CState | MinMax_Idx_OK |
| HSYNC_LOADINIT | MinMax_Var<OK_TH1 && |
| HSYNC_SEARCHING | MinMax_Dif_Now<OK_TH2 |
| HSYNC_COARSELOCK | MinMax_Dif_Now<OK_TH1 |
| HSYNC_FINELOCK | | wherein, for the NTSC system, the reference values for OK_TH1 and OK_TH2 are 44 and 128, respectively.

Figure 11A:
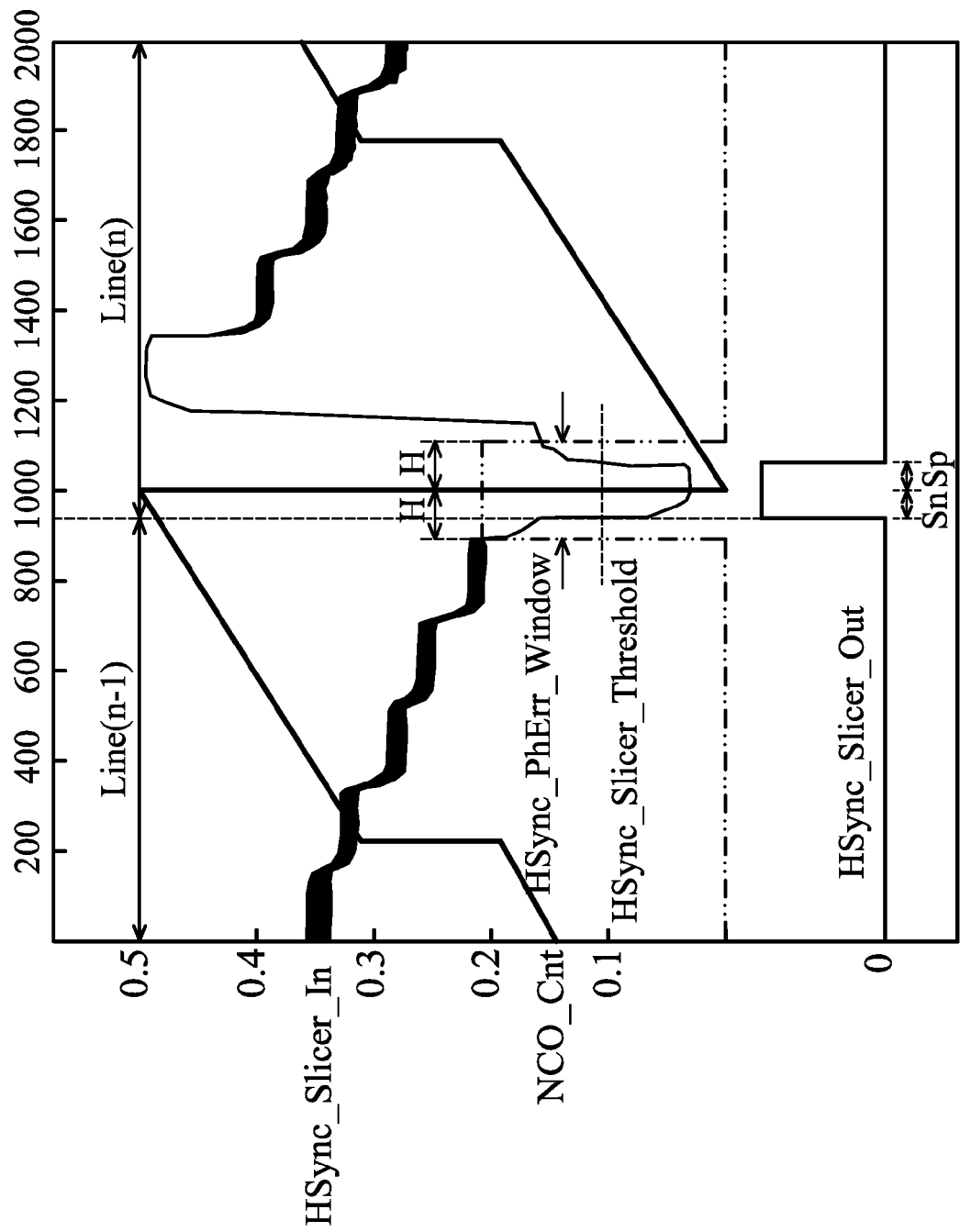
FIG. 11A shows a waveform of a phase error detector according to an embodiment of the invention.
Figure 11B:
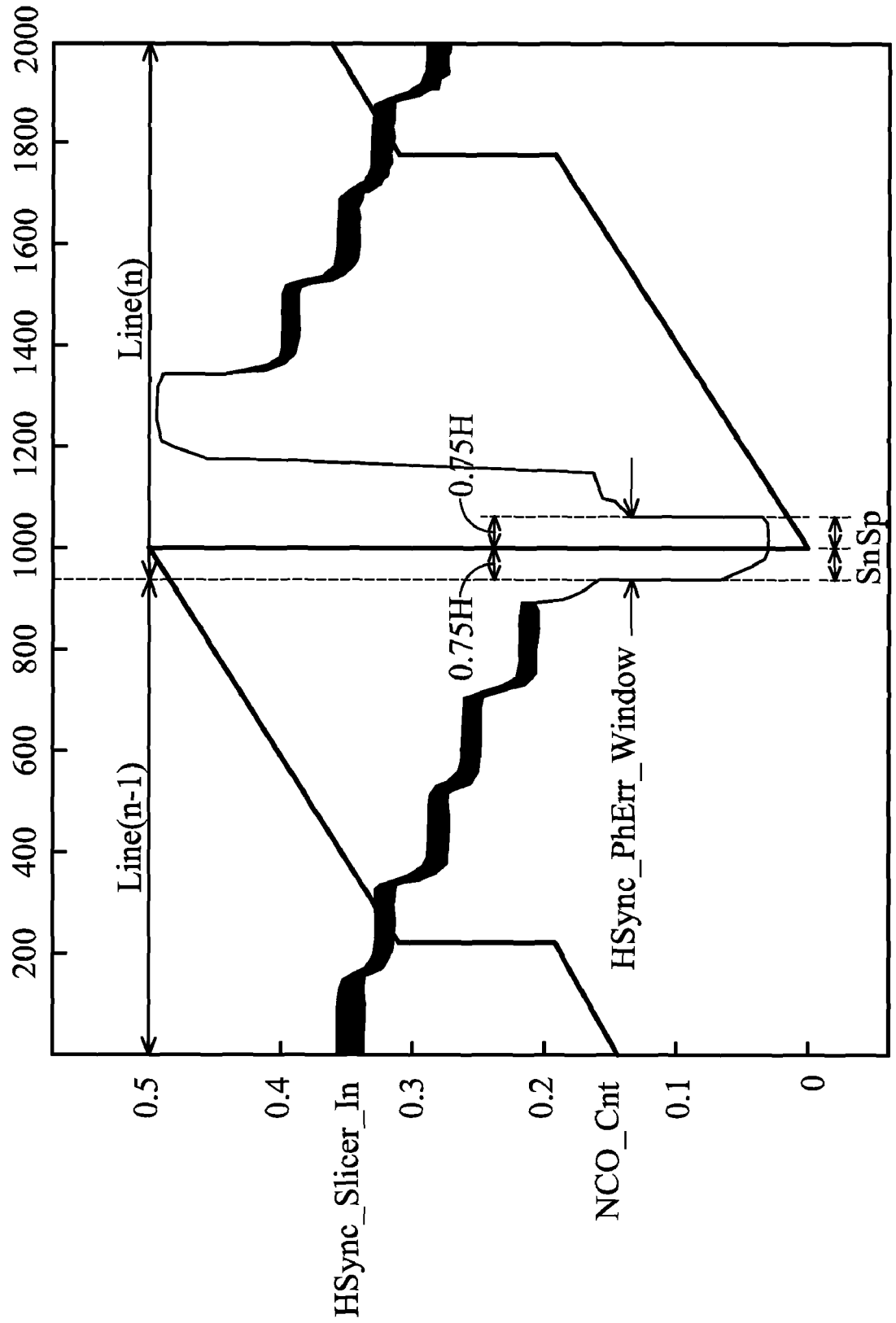
FIG. 11B yet shows a waveform of a phase error detector according to an embodiment of the invention.

Referring back to FIG. 4, the phase error detector 120 generates the signals Ph_Err, HSync_Slicer_Out and HSync_Width_Chk upon reception of signals HSync_Slicer_In and HSync_Slicer_Threshold. The wide bandwidth filtered signal HSync_Slicer_In generated by the LPF 110 is a video signal without a high frequency portion, as shown in FIGS. 11A-B. The slicer threshold HSync_Slicer_Threshold is a dynamic threshold level generated by the dynamic slicer threshold generator 140, and the detail regarding the determination of the slicer threshold HSync_Slicer_Threshold is explained later. Referring to FIG. 11A, with the slicer threshold HSync_Slicer_Threshold, the amplitude of the wide bandwidth filtered signal HSync_Slicer_In greater than the slicer threshold HSync_Slicer_Threshold is characterized as logic 0, and the amplitude of the signal HSync_Slicer_In smaller than the slicer threshold HSync_Slicer_Threshold is characterized as logic 1. As a result, a characterized positive pulse HSync_Slicer_Out is generated. The positive pulse HSync_Slicer_Out is further separated into two parts Sn and Sp by the count value of 0 (wherein Sn is the front portion of the pulse HSync_Slicer_Out, and Sp is the rear portion of the pulse HSync_Slicer_Out). Based on a width H which is the standard width of HSYNC pulse, i.e. 4.7 μs (118 count values), a window HSync_PhErr_Window is defined to calculate the phase error Ph_Err. The window HSync_PhErr_Window is stretched both ways left and right by a distance of H from a center of the count value of 0. Therefore, it has a total width of 2H. The value of Sn is obtained by integrating the left part of the signal HSync_Slicer_Out within the window HSync_PhErr_Window, whereas the value of Sp is obtained by integrating the right part of the signal HSync_Slicer_Out within the window HSync_PhErr_Window. When in the states HSYNC_COARSELOCK or HSYNC_FINELOCK, the phase error Ph_Err may be obtained by the subtraction of Sp and Sn. If the Sn=Sp, the phase error Ph_Err would be 0, which is a case of precise horizontal synchronization. If the Sn>Sp, the phase error Ph_Err would be smaller than 0. If the Sn<Sp, the phase error Ph_Err would be greater than 0. It has to be emphasized that the above calculation of the phase error Ph_Err using Sn and Sp is merely for the two states HSYNC_COARSELOCK and HSYNC_FINELOCK. That is, in the two states the timing recovery circuit 111 is close-looped and the phase error Ph_Err is determined by the phase error detector 120 using the aforementioned parameters Sn and Sp. However, when in the first two states HSYNC_LOADINIT and HSYNC_LOADINIT, the timing recovery circuit 111 is open-looped and the phase error Ph_Err is determined by the variable MinMax_Dif_Now, as categorized below:

TABLE 2

| Calculation of Phase Error Ph_Err | |
|---|---|
| HSync_FSM_CState | Ph_Err |
| HSYNC_LOADINIT | MinMax_Dif_Now |
| HSYNC_SEARCHING | |
| HSYNC_COARSELOCK | Sp-Sn (pulse-width |
| HSYNC_FINELOCK | difference) |

Specifically, the rough line rate offset between a standard scanning line and an actually-received scanning line may be determined in a very short time (i.e. determined in the first two states) before the timing recovery circuit 111 is actually activated. Take NTSC system as an example, in NTSC system, the frequency of scanning line is 15734 Hz. In this case, if the frequency of an actually-received scanning line is 15625 Hz, the rough line rate offset (e.g. 90% of the total line rate offset, namely 90%*109 Hz) therebetween may be determined within the first two states, achieving a very fast synchronization. In addition, the embodiment of the invention may support for the line rate offset tolerance up to about 5%, that is, the tolerable line rate offset between a standard scanning line and an actually-received scanning line may be about 15734*5%=787 Hz (for NTSC system as a standard system), which significantly enhances the synchronization ability upon known skills.

As previously described, in the two states HSYNC_COARSELOCK and HSYN_FINELOCK the calculation of the phase error Ph_Err is achieved using Sn and Sp, wherein the value of Sn is obtained by integrating the left part of the signal HSync_Slicer_Out within the window HSync_PhErr_Window and the value of Sp is obtained by integrating the right part of the signal HSync_Slicer_Out within the window HSync_PhErr_Window. In another embodiment of the invention, however, the value of Sn may be obtained by integrating the left part of the signal HSync_Slicer_In within a newly-defined window HSync_PhErr_Window and the value of Sp may be obtained by integrating the right part of the signal HSync_Slicer_In within the newly-defined window HSync_PhErr_Window, wherein the newly-defined window HSync_PhErr_Window may have a center point at the count value of 0 and a total width of 1.5H (not 2H as in previous embodiment), as shown in FIG. 11B. In this embodiment, the slicer threshold HSync_Slicer_Threshold required in the previous embodiment is no longer needed. Thereafter, the phase error Ph_Err is also obtained by the subtraction of Sp and Sn, as introduced in the previous embodiment. This is called a threshold-free phase error calculation manner.

In addition, the phase error detector 120 also generates a logic signal HSync_Width_Chk which is sent to the phase error gating circuit 126. The logic signal HSync_Width_Chk is used to indicate any scanning line(s) with abnormal-patterned HSYNC pulse. The abnormal-patterned HSYNC pulse refers to the pulse with an improper width (too narrow or too broad). The pattern abnormality would disturb the horizontal synchronization, so the scanning lines thereof must be detected, as explained below.

To perform the phase error detection, three predetermined thresholds are defined to detect the width of the HSYNC pulse: LThld_of_HSync, MThld_of_HSync and HThld_of_HSync. The default values of the thresholds LThld_of_HSync, MThld_of_HSync and HThld_of_HSync may be 0.25H, 0.75H and 1.25H, respectively. In addition, a value St is defined as the integration value of the signal HSync_Slicer_Out, which is Sn plus Sp (St=Sn+Sp). Based on the defined values, the logic signal HSync_Width_Chk may be determined using the following logic condition:

```
if (MThld_of_HSync<=St<=HThld_of_HSync)
        HSync_Width_Chk =      PERIOD_VALID;
else if (LThld_of_HSync<St<=MThld_of_HSync)
        HSync_Width_Chk =      PERIOD_2SHORT;
else if (HThld_of_HSync<St)
        HSync_Width_Chk =      PERIOD_2LONG;
else    HSync_Width_Chk =      PERIOD_UNKNOWN.
```

Figure 1:
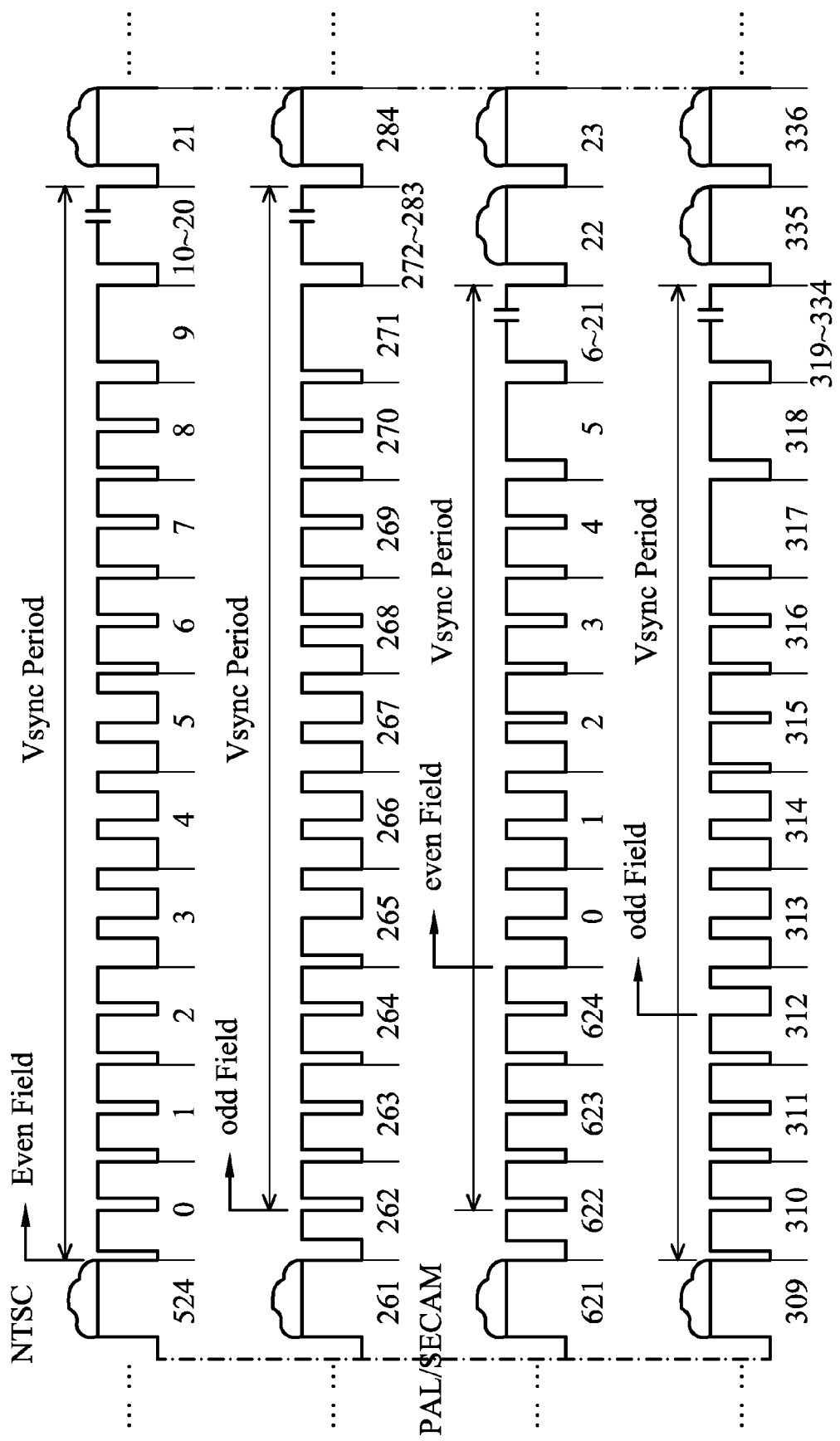
FIG. 1 shows a CVBS waveform of TV systems such as an NTSC or a PAL/SECAM TV system.
Figure 12:
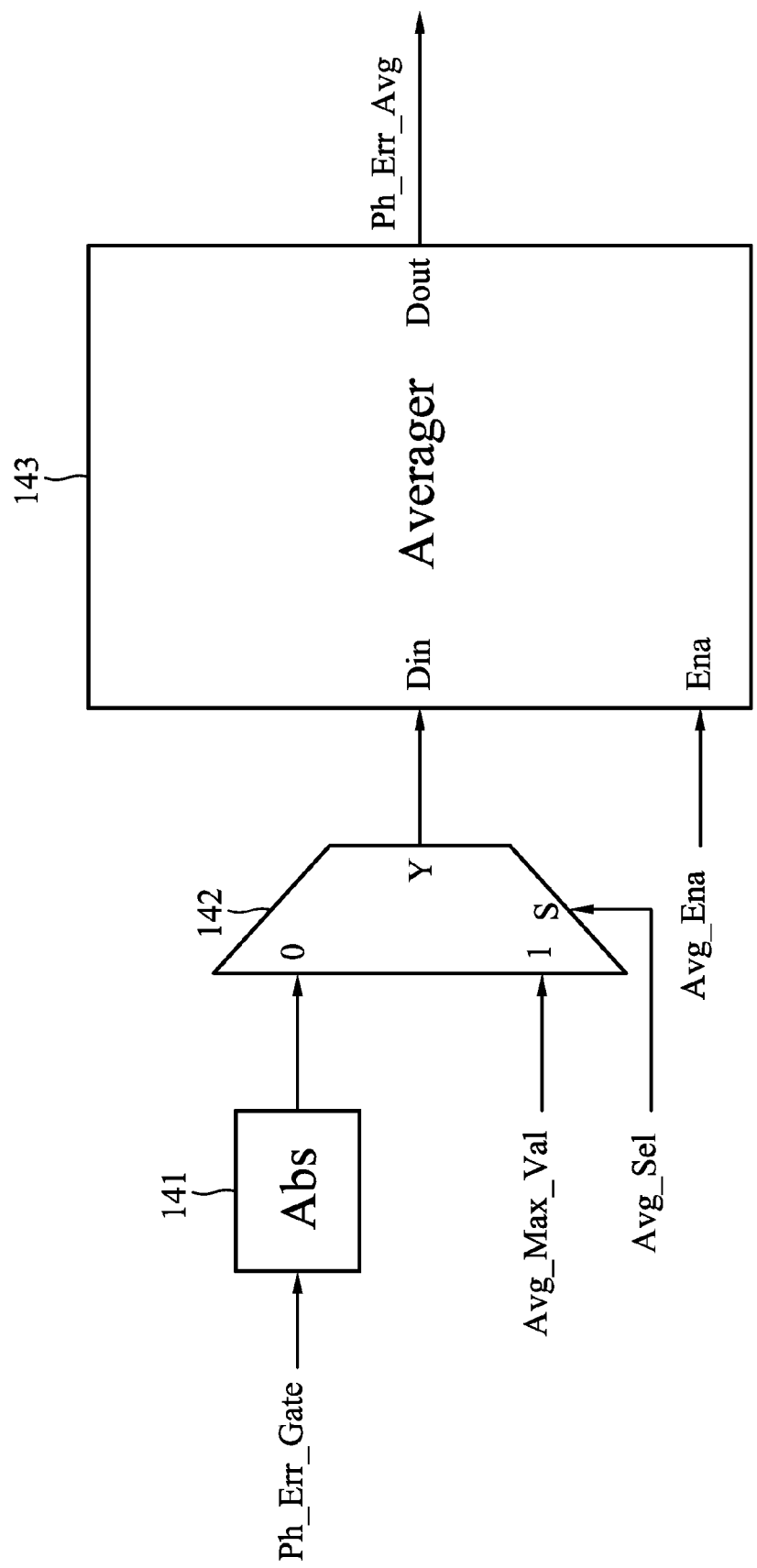
FIG. 12 shows a circuit diagram of a phase error statistics circuit according to an embodiment of the invention.

With the logic condition above, the abnormal-patterned scanning lines may be detected. Thereafter, the abnormal-patterned scanning lines are filtered by the phase error gating circuit 126. FIG. 12 shows a circuit diagram of a phase error gating circuit according to an embodiment of the invention. Take the even field of an NTSC system in FIG. 1 as an example, the scanning lines 0-8 are usually the abnormal-patterned lines. Therefore, they will be detected by the phase error detector 120 and filtered by the phase error gating circuit 126. The output Ph_Err_Gate of the phase error gating circuit 126 is further sent to the phase error statistics circuit 128 and the loop filter 130.

FIG. 12 shows a circuit diagram of a phase error statistics circuit according to an embodiment of the invention. The phase error statistics circuit 128 comprises an absolute value calculator 141, a selector 142 and an averager 143. The absolute value calculator receives the signal Ph_Err_Gate and determines its absolute value. The selector 142 selects the absolute value of a signal Ph_Err_Gate or a maximum average value Avg_Max_Val as its output. The maximum average value Avg_Max_Val is set as large as it can be in order to reflect a worst case initially presented for horizontal synchronization. The selection is made according to an index Avg_Sel. The averager 143 calculates the average phase error Ph_Err_Avg according to the output of the selector 142. The index Avg_Sel and the signal Avg_Ena are generated according to the four state of the schedule control FSM 170.

Figure 13:
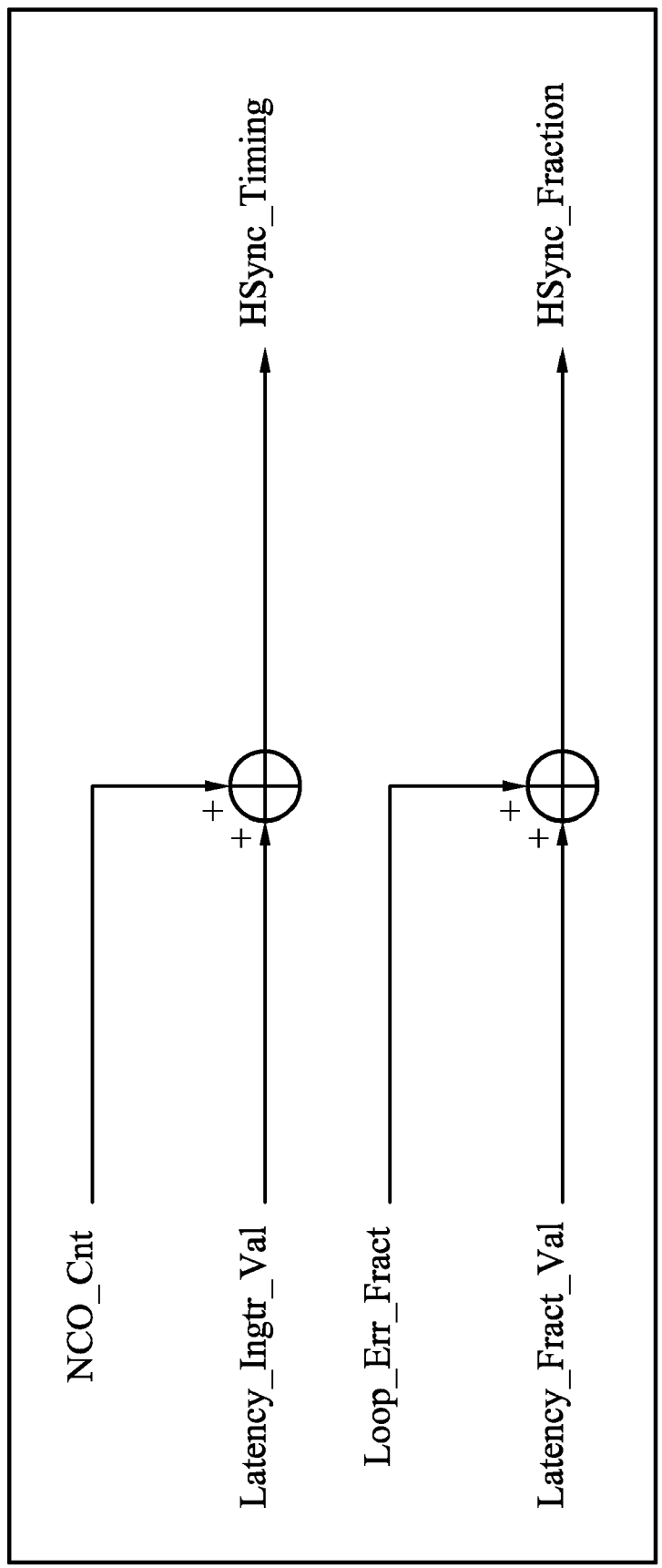
FIG. 13 shows a circuit diagram of a processing latency compensation circuit according to an embodiment of the invention.

Referring back to FIG. 4, the loop filter 130, which is operated in close-looped or open-looped by the four state of the schedule control FSM 170, outputs loop error consisted of two timing indicators Loop_Err_Intgr and Loop_Err_Fract. In more detail, the two timing indicators Loop_Err_Intgr and Loop_Err_Fract are acquired and outputted by bit selectors which select the integer part and fraction part of the loop error, respectively. The timing indicator (loop error) Loop_Err_Intgr is sent to the line rate NCO 150. The output of the line rate NCO 150 (NCO Cnt) and the timing indicator Loop_Err_Fract are respectively used as the line timing reference signals HSync_Fraction and HSync_Timing if there is no latency compensation. In a case where a latency compensation circuit is used, the signals NCO_Cnt and Loop_Err_Fract are sent to a processing latency compensation circuit for time compensation in order for the loop error Loop_Err_Intgr and the line timing signal NCO_Cnt to synchronize with the input video signal. FIG. 13 shows a circuit diagram of a processing latency compensation circuit according to an embodiment of the invention. In FIG. 13, a latency signal Latency_Intgr_Val is added to the line timing signal NCO_Cnt to obtain a line timing reference signal HSync_Timing. The line timing reference signal HSync_Timing indicates the ongoing progress on which the currently-processed scanning line is received (after horizontal synchronization has been achieved), e.g. the count value N (see explanation below). In addition, in FIG. 13, the latency signal Latency_Fract_Val is also added to the timing indicator Loop_Err_Fract to obtain another line timing reference signal HSync_Fraction. The line timing reference signal HSync_Fraction indicates the exact timing for when the phase has been locked. Specifically, the timing for when the phase has been locked may not occur right on a certain count value, the count value N, for example. Instead, it may occur between the count values N and N+1, which can not be expressed by the timing indication signal HSync_Timing. Therefore, a decimal count value between N and N+1 is expressed by the timing indication signal HSync_Fraction.

The invention has been fully described herein. Following, details regarding the generation of the slicer threshold HSync_Slicer_Threshold is explained.

Figure 14:
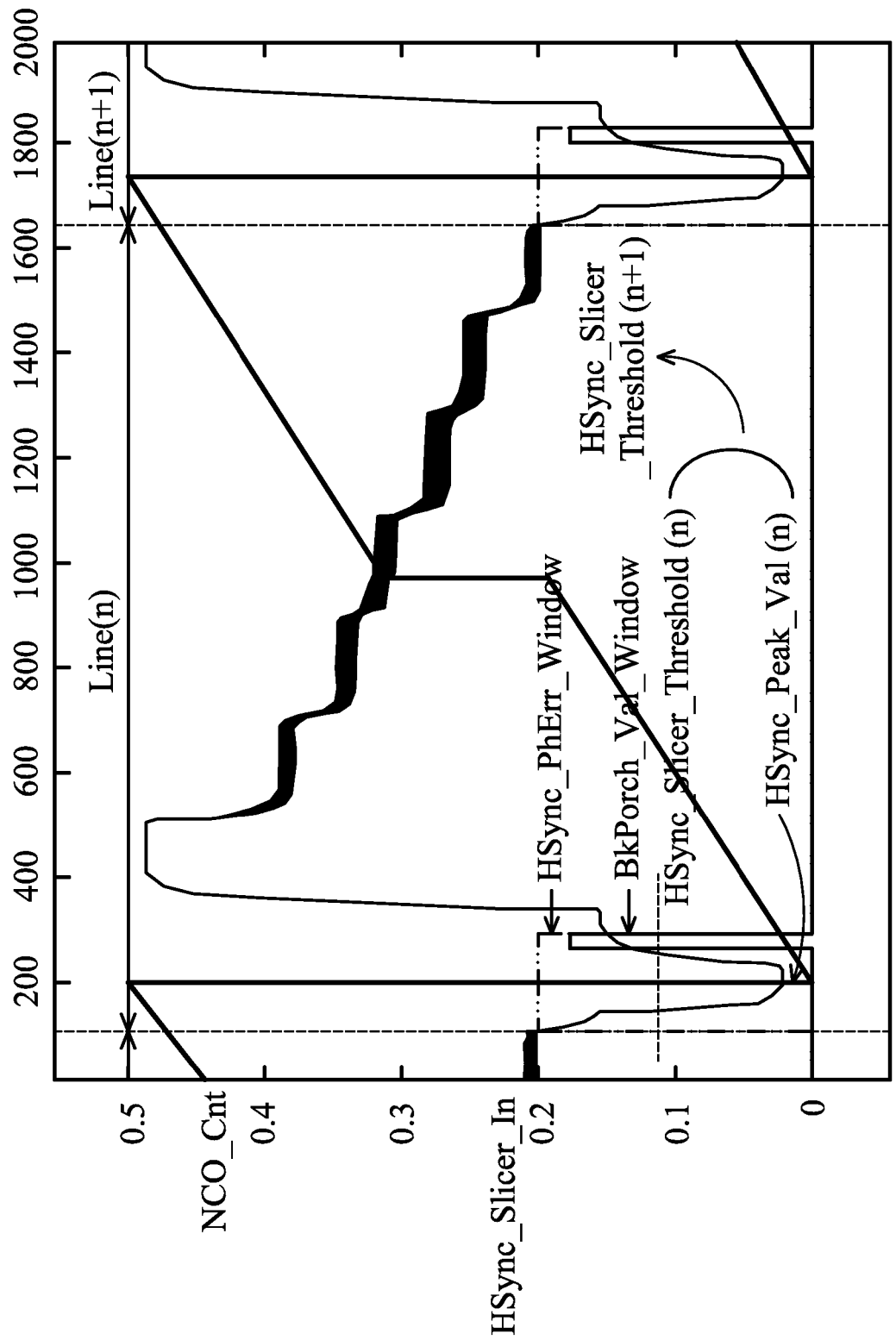
FIG. 14 shows a waveform of a dynamic slicer threshold generator according to an embodiment of the invention.

As stated above, the slicer threshold HSync_Slicer_Threshold is generated by the dynamic slicer threshold generator 140 and further sent to the phase error detector 120 to calculate the phase error Ph_Err. To generate the slicer threshold HSync_Slicer_Threshold, the wide bandwidth filtered signal HSync_Slicer_In of the wide bandwidth LPF 110 and the line timing signal NCO_Cnt generated by the line rate NCO 150 are used, as shown in FIG. 14 below. Based on the two signals, the dynamic slicer threshold generator 140 defines the following parameters:

a window BkPorch_Val_Window;
a value HSync_Peak_Val; and
a value BackPorch_Val.

Referring to FIG. 14, the window BkPorch_Val_Window is defined to estimate the level of the Backporch. The value HSync_Peak_Val is the minimum (or maximum) value of the wide bandwidth filtered signal HSync_Slicer_In within the window HSync_PhErr_Window. The value BackPorch_Val is the statistic average value of the wide bandwidth filtered signal HSync_Slicer_In within the window BkPorch_Val_Window. Based on this, when the count value of line timing signal NCO_Cnt is PosBound, the HSync_Slicer_Threshold (n+1) is determined based on the following:

$$(HSync\_Peak\_Val\,(n) + BackPorch\_Val\,(n))/2, \text{ if the } HSync\_Width\_Chk \text{ is not PERIOD\_2LONG}, \quad (1)$$

or maintain as the HSync_Slicer_Threshold (n), which was determined during the previous scanning line, if the HSync_Width_Chk is PERIOD_2LONG. (2)

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A video horizontal synchronizer outputting a line timing signal and an indicating flag of a received video signal for use in a video signal post-processing unit, comprising:
   a filter circuit outputting a wide bandwidth filtered signal and a narrow bandwidth filtered signal of the received video signal;
   a dynamic slicer threshold generator generating a slicer threshold according to the wide bandwidth filtered signal within a time window;
   a timing recovery circuit generating a phase error and the line timing signal according to the wide bandwidth filtered signal and the slicer threshold;
   a phase error statistics circuit averaging the phase error to generate an average phase error;
   a HSYNC checker generating a matching flag indicating whether a periodic pattern appears in the narrow bandwidth filtered signal according to the line timing signal; and
   a finite state machine (FSM) controlling the dynamic slicer threshold generator, the timing recovery circuit, the phase error statistics circuit and the HSYNC checker according the status of the video horizontal synchronizer and generating an indicating flag when the average phase error is small enough and the matching flag is confirmed.

2. The video horizontal synchronizer as claimed in claim 1, wherein the time window is centered at an initial index (wrap-around point) of the line timing signal.

3. The video horizontal synchronizer as claimed in claim 1, wherein the filter comprises:
   a wide bandwidth LPF filtering the received video signal to output the wide bandwidth filtered signal; and
   a narrow bandwidth LPF filtering the received video signal to output the narrow bandwidth filtered signal.

4. The video horizontal synchronizer as claimed in claim 3, wherein the HSYNC checker generates the matching flag when the minimum of the narrow bandwidth filtered signal corresponds to the same index of the line timing signal.

5. The video horizontal synchronizer as claimed in claim 3, wherein the timing recovery circuit comprises:
   a phase error detector generating the phase error as a pulse-width difference between front and rear portions of a pulse, wherein the pulse is generated by comparing the wide bandwidth filtered signal and the slicer threshold wherein the front and rear portions of the pulse are separated at the initial index of the line timing signal;
   a loop filter generating the loop error according to the phase error and the state of the video horizontal synchronizer; and
   a numerically controlled oscillator (NCO) generating the line timing signal according to the loop error.

6. The video horizontal synchronizer as claimed in claim 5, wherein the finite state machine (FSM) operates the loop filter in a close-loop mode or an open-loop mode according to the state of video horizontal synchronizer.

7. The video horizontal synchronizer as claimed in claim 5, wherein the loop filter further comprises:
   a bit selector acquiring and outputting the integer part of the loop error to the numerically controlled oscillator (NCO).

8. The video horizontal synchronizer as claimed in claim 7, wherein the video horizontal synchronizer further comprises:
   a latency compensation circuit compensating the line timing signal before sending the line timing signal to the video signal post-processing unit.

9. The video horizontal synchronizer as claimed in claim 5, wherein the phase error detector further outputs a logic signal (MinMax_Dif_OK) indicating that the width of the pulse is abnormal.

10. The video horizontal synchronizer as claimed in claim 9, wherein the timing recovery circuit further comprises a phase error gating circuit filtering out the phase error with the abnormal pulse according to the logic signal before sending the phase error to the loop filter.

* * * * *